(12) United States Patent
Hlebowitsh et al.

(10) Patent No.: US 8,471,592 B1
(45) Date of Patent: Jun. 25, 2013

(54) RECURSIVE CODE LOGIC

(75) Inventors: Paul G. Hlebowitsh, Iowa City, IA (US); Robert A. Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/324,381

(22) Filed: Dec. 13, 2011

(51) Int. Cl.
| H03K 19/173 | (2006.01) |
| H03K 19/00 | (2006.01) |
| H01L 25/00 | (2006.01) |
| G06F 17/50 | (2006.01) |

(52) U.S. Cl.
USPC ............................... 326/38; 703/14; 326/101

(58) Field of Classification Search
USPC ................. 326/37–41, 47; 716/100
See application file for complete search history.

(56) References Cited

U.S. PATENT DOCUMENTS

| 5,233,233 | A | * | 8/1993 | Inoue et al. | 327/408 |
| 5,796,624 | A | * | 8/1998 | Sridhar et al. | 703/14 |
| 6,304,987 | B1 | * | 10/2001 | Whetsel, Jr. | 714/724 |
| 2010/0321061 | A1 | * | 12/2010 | Leshner et al. | 326/36 |
| 2011/0035427 | A1 | * | 2/2011 | Joseph et al. | 708/313 |

* cited by examiner

*Primary Examiner* — Shawki Ismail
*Assistant Examiner* — Dylan White
(74) *Attorney, Agent, or Firm* — William B. Kempler; Wade J. Brady, III; Frederick J. Telecky, Jr.

(57) ABSTRACT

A logic device includes a transmission gate block configured to receive a binary input and a control input, the transmission gate block configured to provide a multi-bit output that is correlated from the binary input and in response to the control input having a first value. A state driver block is activated to drive one of a low state bit pattern or a high state bit pattern to the multi-bit output in response to the control input having a second value, which is different from the first value.

20 Claims, 8 Drawing Sheets

RECURSIVE CODE LOGIC

BACKGROUND

Classic digital logic design utilizes Boolean mathematical expressions to build digital logic circuits since there is a one-to-one correspondence between such expressions and their digital representation. Boolean identities can be utilized to reduce these expressions, and thus minimize both combinational and sequential circuit complexity (e.g., the number of transistors used in the circuit). Other tools such as DeMorgan's Theorem and truth tables can also be employed to simplify the expressions and thereby minimize the number of circuits to implement a given digital logic design. Such classical approaches generally provide a logic representation that minimizes the number of circuits yet these approaches may not always provide the best solution for mitigating circuitry depending on the nature of the underlying logic application.

SUMMARY

In one example, a logic device includes a transmission gate block configured to receive a multi-bit binary input and a control input, the transmission gate block configured to provide a multi-bit output that is correlated from the binary input and in response to the control input having a first value. A state driver block is activated to drive one of a low state bit pattern or a high state bit pattern to the multi-bit output in response to the control input having a second value, which is different from the first value.

In another example, a method includes providing a base functionality for a logic circuit. The logic circuit is configured as a symmetrical multi-bit generator that alternates between a multi-bit output, which is correlated from a binary input, and one of a high or low bit pattern according to a control input. The method also includes defining a plurality of blocks having a transmission gate block to provide the multi-bit output and a state driver block to supply the high or low bit pattern, each of the plurality of blocks configured to provide the base functionality. The method also includes recursively coupling the plurality of blocks to provide an aggregate logic circuit that is configured to provide a symmetrical output responsive to the multi-bit input and the control input.

In yet another example, an integrated circuit chip is provided. The integrated circuit chip includes an upper transmission gate block to supply a multi-bit output at a first output in response to being activated by a control input. The multi-bit output is correlated to a multi-bit input. A high state driver provides a high bit pattern at the first output in response to the upper transmission gate block being deactivated by the control input. The integrated circuit chip also includes a lower transmission gate block to supply a multi-bit output at a second output in response to being activated by the control input. The multi-bit output at the second output is correlated to the multi-bit input and being activated alternately from activation of the upper transmission gate block. A low state driver can provide a low bit pattern at the second output in response to the lower transmission gate block being deactivated by the control input.

DETAILED DESCRIPTION

Figure 1:
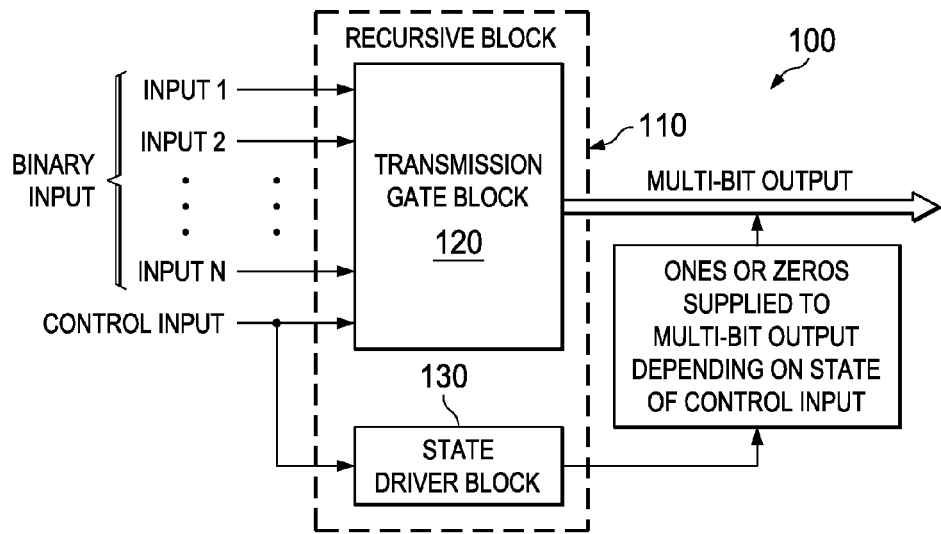
FIG. 1 illustrates an example of a logic device for generating a symmetrical multi-bit output from a recursive block.

FIG. 1 illustrates an example of a logic device 100 for generating a symmetrical, multi-bit output from a recursive block 110. A plurality of the blocks 110 can be combined recursively to construct larger aggregate circuits with corresponding logic functionality. The recursive block 110 represents a basic logic function that can be applied repetitively and in series/parallel to build larger circuit designs. For example, the recursive block 110 could be a multi-bit generator for symmetrical patterns, wherein the recursive block is arranged with other recursive blocks to form the generator. Such recursive form (e.g., defining a base function and repeating it to construct larger logic circuit designs and corresponding circuits) is a departure from standard design procedures which may rely on truth tables or other classical design approaches to attempt to minimize the number of circuits employed in a given design. Utilizing the recursive form described herein, circuits that operate on symmetrical bit patterns can be reduced in complexity. For example, a topological approach can be applied where circuit functionality has been determined, a base functionality can be defined to implement such circuit functionality, wherein the base functionality can then be applied recursively to build larger circuits which leads to a reduction in circuit complexity over classical design approaches.

As shown, the recursive block 110 can include a transmission gate block 120 configured to receive a binary input and a control input. The transmission gate block 120 can be configured to provide a multi-bit output that is correlated from the binary input and in response to the control input having a first value (e.g., low or zero value). A state driver block 130 can be activated to drive one of a low state bit pattern (e.g., all zeros) or a high state bit pattern (e.g., all ones) to the multi-bit output in response to the control input having a second value (e.g., high or one's value), which is different from the first value. Although the control input is described as a separate input for purposes of explanation, it is noted that the control input can be at least one bit of the binary input to the transmission gate block 120. The multi-bit output can be associated with a symmetrical code pattern that is generated in parallel to the low state bit pattern or the high state bit pattern supplied by the state driver block 130.

For example, if 1100 were the multi-bit output, and depending on the state of the control input (e.g., low), the parallel pattern driven by the state driver 130 could be low yielding an output of 1100, 0000, wherein 1100 is the multi-bit output and 0000 is the parallel low state output supplied by the state driver block. If the control input were to change, then the multi-bit output might then appear on lower order bits, wherein 1111 could be paralleled on the upper bits in the following example configuration 1111, 1100. Various other examples will be described herein for the multi-bit output.

Figure 2:
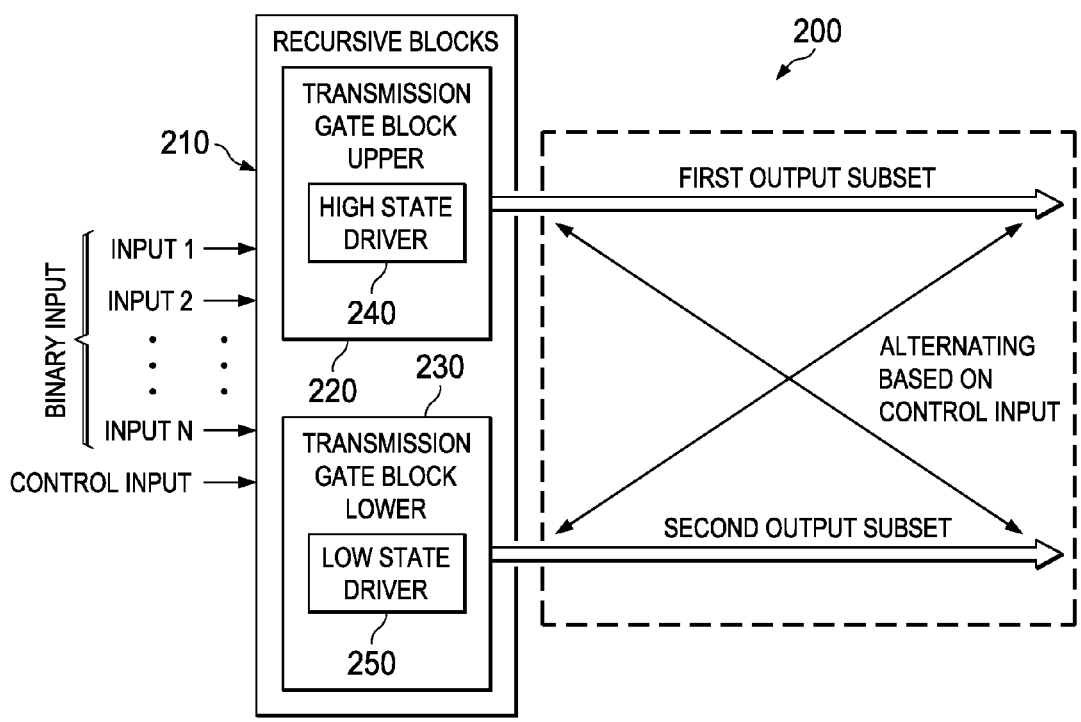
FIG. 2 illustrates an example of a logic device for generating a symmetrical multi-bit output from a recursive block having multiple transmission gate blocks.

The control input can cause the multi-bit output to alternate from a first subset of outputs to a second subset of outputs supplied by the transmission gate block 120 such as disclosed herein with respect to FIG. 2. For example, the control input can cause one of the first subset of outputs to be inactive and the second subset of outputs to drive the multi-bit output or the control input can cause one of the first subset of outputs to drive the multi-bit output and the second subset of outputs to be inactive. Additionally, the control input can cause the low state bit pattern or the high state bit pattern from the state driver block 130 to appear at the output of the inactive of the first subset of outputs or the second subset of outputs.

As used herein, the term symmetrical code refers to a type of alternating pattern, wherein a set of multi-bit outputs is arranged with another set of outputs supplied by the state driver block 130. For example, 1111,0000 or 1111,1111 is a symmetrical pattern of multi-bit outputs arranged with either a low or high set of zeros or ones supplied by the state driver block 130. In one particular example, the symmetrical code could be thermometer code or in another example, a binary coded decimal (BCD) could be the symmetrical code. Thermometer code is sometimes referred to as unary coding which is an entropy encoding that represents a natural number, n, with n ones followed by a zero (if natural number is understood as non-negative integer) or with n−1 ones followed by a zero (if natural number is understood as strictly positive integer). For example, the number 5 can be represented as 111110 or 11110. Some representations use n or n−1 zeros followed by a one, wherein the ones and zeros are interchangeable without loss of generality. Similarly, BCD code is a digital encoding method for numbers using decimal notation, with each decimal digit represented by its own binary sequence. In BCD, a numeral is usually represented by four bits which, in general, represent the decimal range 0 through 9. Other bit patterns are sometimes used for a sign or for other indications (e.g., error or overflow). Uncompressed (or zoned) BCD consumes a byte for each represented numeral, whereas compressed (or packed) BCD typically carries two numerals in a single byte by taking advantage of the fact that four bits can represent the full numeral range.

As noted previously, the transmission gate block 120 and the state driver block 130 can be configured in a recursive manner to provide a larger circuit function. For example, the larger circuit function can include an upper portion of recursive blocks 110, wherein each portion of the recursive blocks can include an upper transmission gate block configured of parallel complimentary transistors and an upper state driver block configured of transistors having drain elements pulled high as illustrated herein with respect to FIGS. 4 and 5. The larger circuit function can also include a lower portion of recursive blocks 110, wherein each portion of the recursive blocks can include a lower transmission gate block configured of parallel complimentary transistors and a lower state driver block configured of transistors having source elements pulled low, for example.

FIG. 2 illustrates an example of a logic device 200 for generating a symmetrical multi-bit output from a recursive block 210 having multiple transmission gate blocks 220 and 230 that can be employed to build larger circuit functionality. The recursive block 210 can be implemented as part of an integrated circuit chip that includes an upper transmission gate block 220 to generate a first output subset and a high state driver 240 to supply a high bit pattern when the first output subset is inactive. The recursive block can also include a lower transmission gate block 230 to generate a second output subset and a low state driver 250 to supply a low bit pattern when the second output subset is inactive. A control input can be provided to alternate between the first output subset and the second output subset. As noted previously, the control input can be one of the binary inputs. As shown, the upper transmission gate block 220, the high state driver 240, the lower transmission gate block 230, and the low state driver 250 can be configured as a recursive block 210 that is combined with other recursive blocks to provide larger circuit functionality, such as will be shown and described in herein with respect to FIG. 3 where several blocks of upper and lower transmission gate blocks having high and low state drivers respectively are configured. The symmetrical multi-bit output described above appears on the active of the first output subset or second output subset depending on the state of the control input. Similarly, the control input causes the high bit pattern or the low bit pattern generated by the high state driver 240 or low state driver 250 to appear at the inactive of the first output subset or the second output subset. Thus, the transmission gate blocks 220, 230 and their associated state drivers 240, 250 each operates to generate their respective outputs mutually exclusively in response to a control signal.

Figure 3:
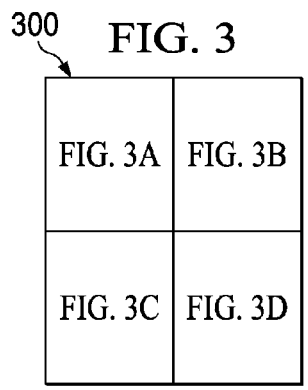
FIG. 3 illustrates an example of a logic device that applies recursive blocks to generate thermometer code output.
Figure 3A:
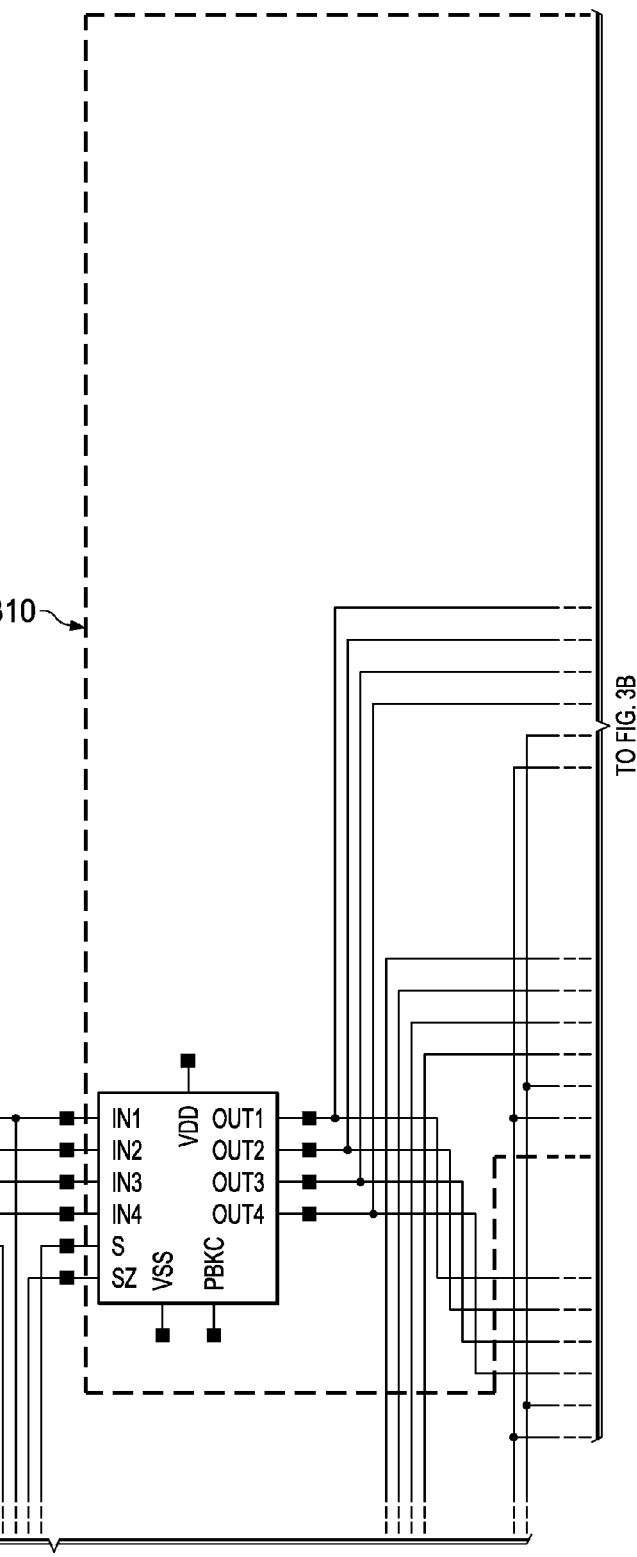
Figure 3B:
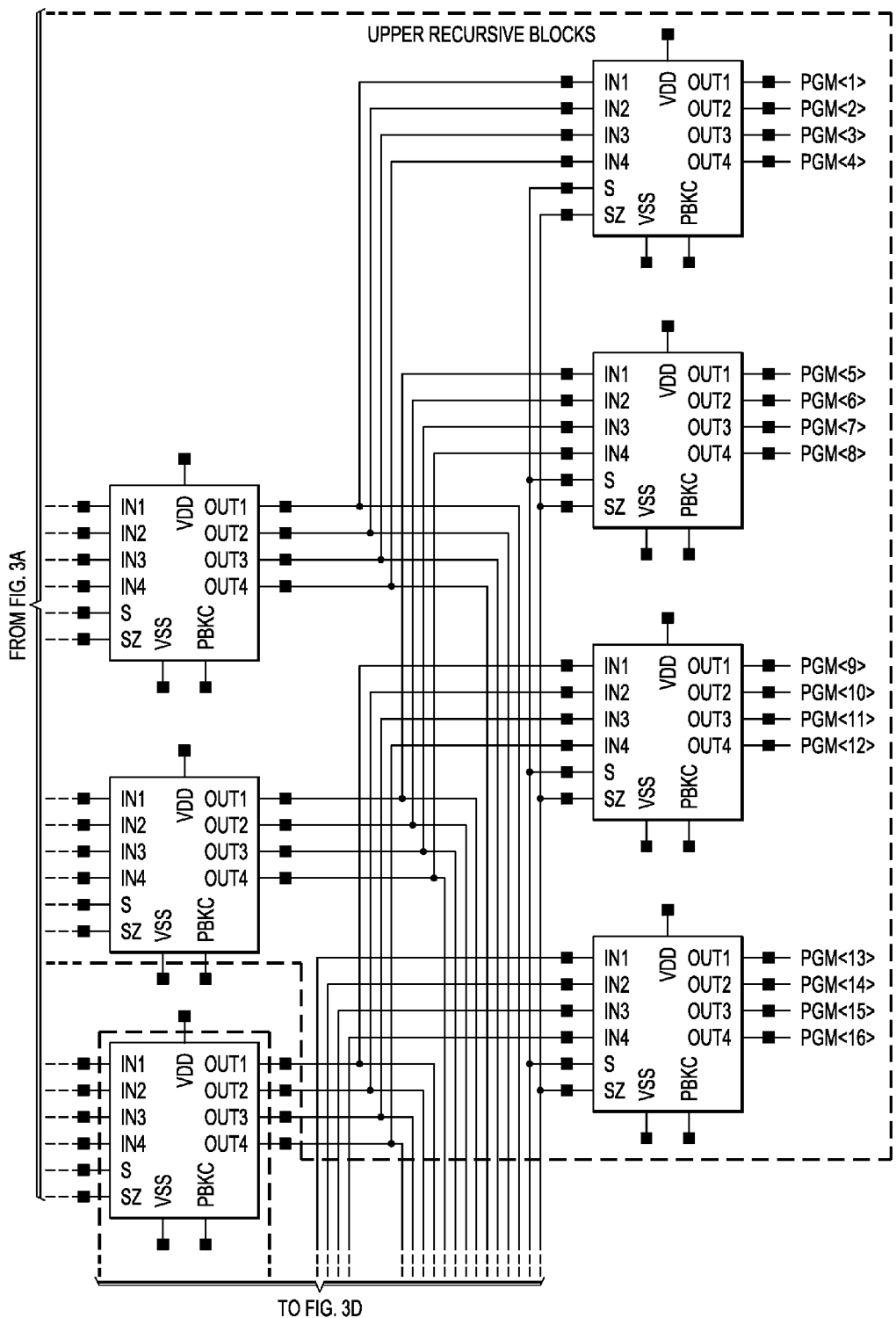
Figure 3C:
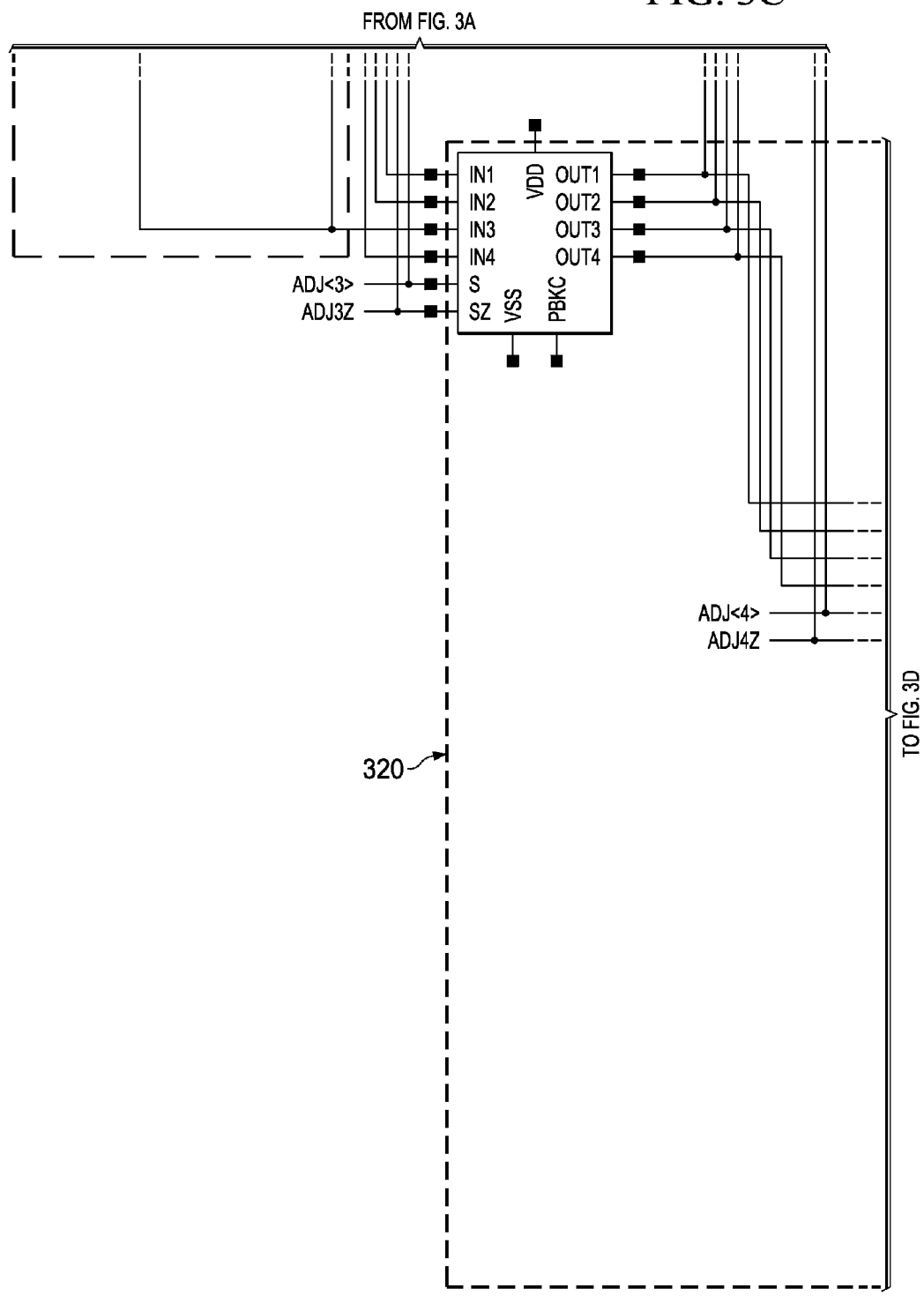
Figure 3D:
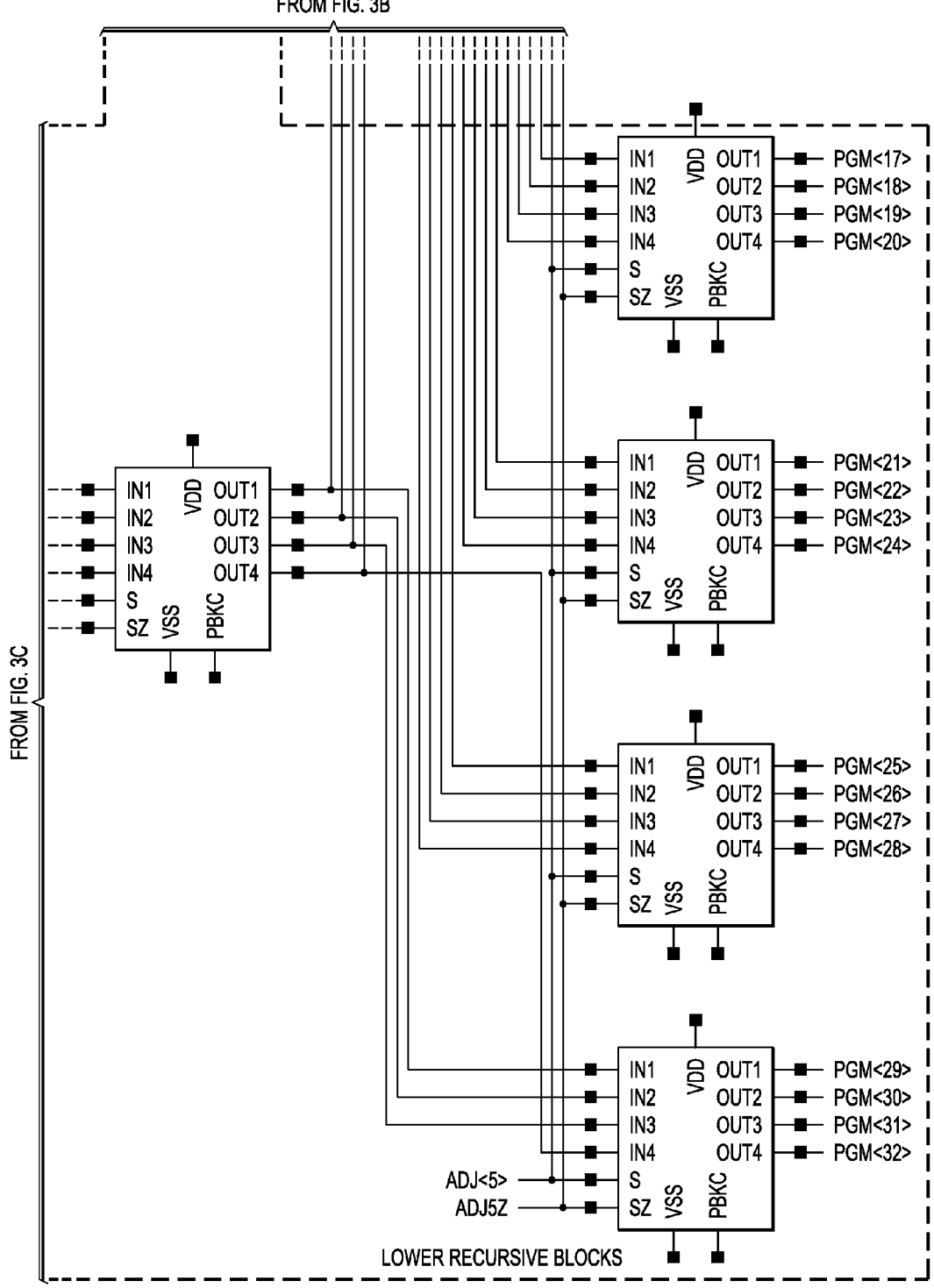

FIG. 3 illustrates an example of a logic device 300 that applies recursive blocks to generate thermometer code output. A dashed line 310 defines a set of upper recursive blocks which are represented as rectangles and another dashed line 320 defines a set of lower recursive blocks which are represented as squares. A set of input logic including an OR gate and an AND gate are defined by line 330, wherein the input logic drives one block each from the upper recursive blocks and the lower recursive blocks, respectively. Each of the recursive blocks in the logic device 300 includes four binary inputs (e.g., h1, h2, h3, h4) and two control inputs (e.g., S and SZ). Each of the recursive blocks also generates four output bits. It is noted that smaller or larger recursive circuits can be built from the basic structure shown in the example device 300. For example, the logic device 300 can implement the logic of thermometer code recursively, which leads to a much smaller circuit. For instance, using the output of a two-input thermometer code circuit, a recursive logic table can be constructed for three-input versions, and so forth, such as to provide a corresponding five-input, thirty two-output thermometer code circuit as demonstrated by the logic device 300. All the rectangular blocks in the upper recursive set can be implemented by using the example circuit 400 depicted in FIG. 4. All the square blocks in the lower recursive set can be implemented by the example circuit 500 depicted in FIG. 5.

Both of the circuits depicted in FIGS. 4 and 5 (described below) pass 0V, +5V, or the two input thermometer code output such as:

| INPUT | OUTPUT |
| --- | --- |
| 00 | 1000 |
| 01 | 1100 |
| 10 | 1110 |
| 11 | 1111 |

The upper and lower recursive blocks then uses the third bit of input (e.g., control input) to switch between sending the 2 bit input thermometer code output to its outputs or sending 0V, or +5V. When the third bit is low, the circuit switches 0V into the last 4 bits, and the 2-bit output into the first 4 bits as follows:

| INPUT | 2-bit OUTPUT | 3-bit OUTPUT |
| --- | --- | --- |
| 000 | 1000 | 1000, 0000 |
| 001 | 1100 | 1100, 0000 |

-continued

| INPUT | 2-bit OUTPUT | 3-bit OUTPUT |
|---|---|---|
| 010 | 1110 | 1110, 0000 |
| 011 | 1111 | 1111, 0000 |

When the third bit is high, the circuit switches +5V into the first 4 bits, and the 2-bit output into the last 4 bits as follows:

| INPUT | 2-bit OUTPUT | 3-bit OUTPUT |
|---|---|---|
| 100 | 1000 | 1111, 1000 |
| 101 | 1100 | 1111, 1100 |
| 110 | 1110 | 1111, 1110 |
| 111 | 1111 | 1111, 1111 |

As a result, the 3-bit thermometer code output table can be constructed recursively from the 2-bit thermometer code output table. This recursive process can be continued until there is a 5-bit input as depicted in the logic device 300. The logic device 300 and the methods described herein reuse information calculated by a small collection of logic gates by switching the information to the outputs, instead of directly calculating the information for each output. For example, most of the information in the thermometer code logic table is redundant, and can be built from smaller blocks and such techniques can be applied to other symmetrical, multi-bit codes. The logic device 300 in the example of FIG. 3 can be constructed in this manner as to utilize approximately a third of the transistors as compared with the typical solution, and provides less propagation delay as a result.

Figure 4:
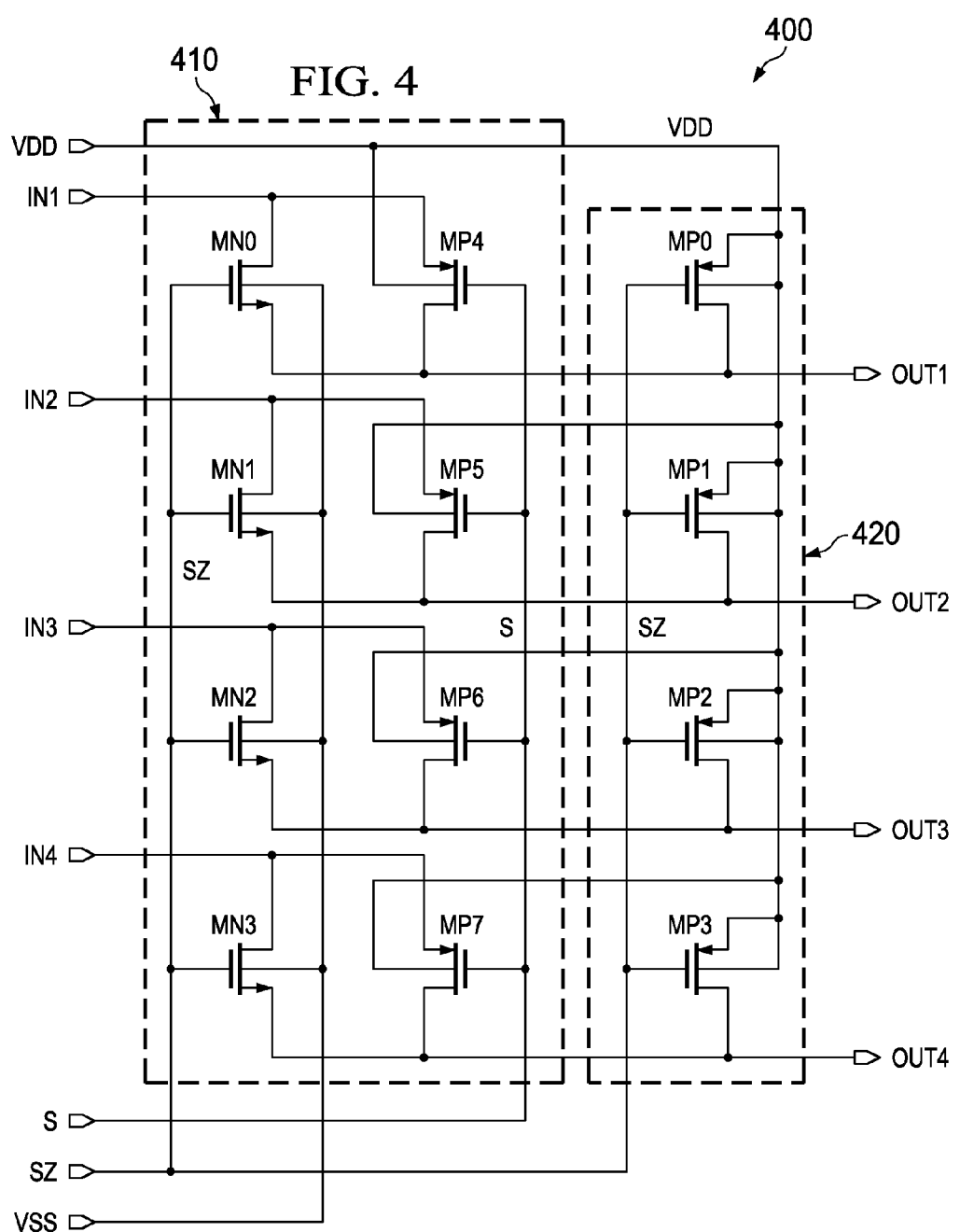
FIG. 4 illustrates an example of a recursive block that employs a block of transmission gates and a block of high state drivers.

FIG. 4 illustrates an example of a recursive block 400 that employs a block of transmission gates 410 and a block of high state drivers 420. The transmission gates 410 can include one or more parallel complimentary pair of switches (e.g., each including one NMOS FET and one PMOS FET) that are employed to pass thermometer code input to outputs 1-4 based on control inputs S and SZ, which are complimentary from one another. For example, when S is high, SZ is low and when S is low, SZ is high. As noted previously, when the control input causes the transmission gates block 410 to pass thermometer code to the outputs, the high state drivers 420 are disabled via the control inputs. Likewise, when the control inputs disable the transmission gate block 410, the high state drivers 420 are enabled to pass all ones from VDD. As shown, power rails VDD and VSS are supplied to the device 400 to provide corresponding high state and low state outputs.

Figure 5:
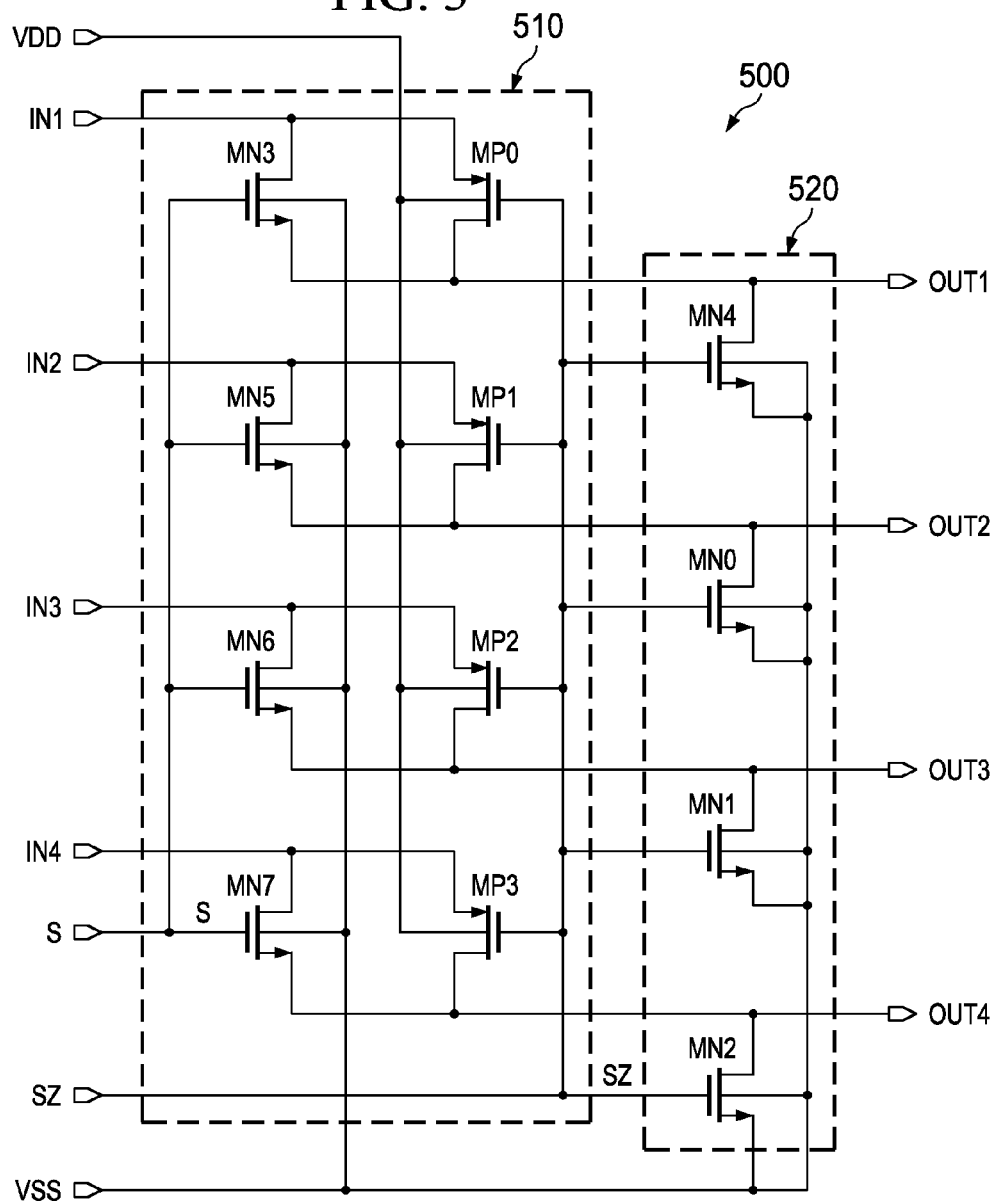
FIG. 5 illustrates an example of a recursive block that employs a block of transmission gates and a block of low state drivers.

FIG. 5 illustrates an example of a recursive block 500 that employs a block of transmission gates 510 and a block of low state drivers 520. Similar to the circuit depicted in FIG. 4 above, the transmission gates 510 can include one or more parallel complimentary pair of (e.g., each including one NMOS FET and one PMOS FET) that are employed to pass thermometer code input to outputs 1-4 based on control inputs S and SZ which are complimentary from one another (e.g., when S is high, SZ is low and when S is low, SZ is high). As noted previously, when the control input causes the transmission gates block 510 to pass thermometer code to the outputs, the low state drivers 520 are disabled via the control inputs. Likewise, when the control inputs disable the transmission gate block 510, the low state drivers 520 are enabled to pass all zeros from VSS. As shown, power rails VDD and VSS are supplied to the device 500.

Figure 6:
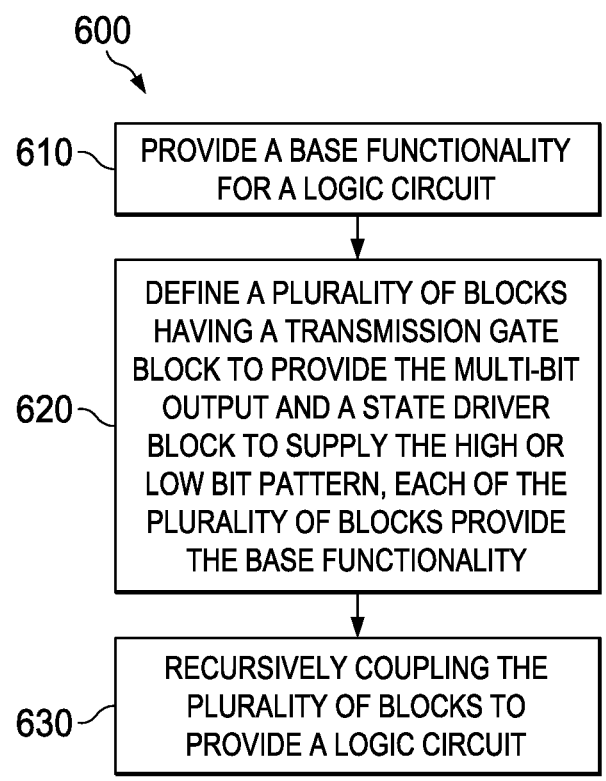
FIG. 6 illustrates a method for building circuit functionality in a recursive manner.

In view of the foregoing structural and functional features described above, an example method will be better appreciated with reference to FIG. 6. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an IC or a controller, for example.

FIG. 6 illustrates a method 600 for building circuit functionality in a recursive manner. The method 600 includes providing a base functionality for a logic circuit at 610. For example, the logic circuit can be configured as a symmetrical multi-bit generator that alternates between a multi-bit output that is correlated to a multi-bit input and either a high or low bit pattern according to a control input. At 620, the method 600 includes defining a plurality blocks having a transmission gate block to provide the multi-bit output and a state driver block to supply the high or low bit pattern, wherein each of the plurality of blocks provide the base functionality. At 630, the method 600 includes recursively coupling the plurality of blocks to provide a logic circuit that is responsive to the multi-bit input and the control input. The recursively coupling at 630 can include repeatedly paralleling the transmission gate blocks and the state driver blocks to build larger circuits (e.g., building a multi-bit output circuit from smaller bit outputs).

In one example, the symmetrical multi-bit generator can generate thermometer code or BCD code. The method 600 can include alternating between a first output subset and a second output subset based on a control input. This can include causing one of the first output subset to be inactive and the second output subset to drive the multi-bit output or causing one of the first output subset to drive the multi-bit output and the second output subset to be inactive. The method 600 can also include supplying the high or low bit pattern to the inactive of the first output subset or the second output subset In another example, the method 600 can include configuring complimentary transistor pairs to pass the multi-bit output (e.g., matched NMOS and PMOS pair). This can include configuring a bank of transistors tied to a drain voltage to supply the high bit pattern and configuring a bank of transistors tied to a source ground to supply the low bit pattern depending on the control input.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A logic device, comprising:
    a transmission gate block configured to receive a multi-bit binary input comprising 3 or more independent signals and a control input, the transmission gate block configured to provide a multi-bit output that is correlated from the binary input and in response to the control input having a first value; and a state driver block activated to drive one of a low state bit pattern or a high state bit pattern to the multi-bit output in response to the control input having a second value, which is different from the first value.

2. The logic device of claim 1, wherein the control input is at least one bit of the binary input.

3. The logic device of claim 1, further comprising:
at least one additional transmission gate block and
at least one additional state driver block, each of the transmission gate block being operatively associated with a respective one of the state driver blocks to provide a respective transmission gate and state block pair, each respective transmission gate and state block pair being configured recursively.

4. The logic device of claim 3, wherein the logic device comprises an upper portion of recursive blocks, each of the recursive blocks in the upper portion of recursive blocks includes an upper transmission gate block comprising parallel complimentary transistors and an upper state driver block comprising transistors having drain elements configured, when activated, to be pulled high.

5. The logic device of claim 3, wherein the logic device comprises a lower portion of recursive blocks, each of the recursive blocks in the lower portion of recursive blocks includes a lower transmission gate block comprising parallel complimentary transistors and a lower state driver block comprising transistors having source elements, when activated, to be pulled low.

6. A logic device, comprising:
a transmission gate block configured to receive a multi-bit binary input and a control input, the transmission gate block configured to provide a multi-bit output that is correlated from the binary input and in response to the control input having a first value; and
a state driver block activated to drive one of a low state bit pattern or a high state bit pattern to the multi-bit output in response to the control input having a second value, which is different from the first value,
wherein the multi-bit output comprises a symmetrical code pattern that is generated in parallel to the one of the low state bit pattern or the high state bit pattern.

7. The logic device of claim 6, wherein the control input causes the multi-bit output to alternate from a first subset of outputs to a second subset of outputs supplied by the transmission gate block.

8. The logic device of claim 7, wherein the control input causes one of the first subset of outputs to be inactive and the second subset of outputs to provide the multi-bit output or the control input causes one of the first subset of outputs to provide the multi-bit output and the second subset of outputs to be inactive.

9. The logic device of claim 8, wherein the control input causes the low state bit pattern or the high state bit pattern to be provided at which one of the first subset of outputs or the second subset of outputs is inactive in response to the control input.

10. The logic device of claim 6, wherein the symmetrical code pattern comprises thermometer code or binary coded decimal (BCD) code.

11. A method, comprising:
providing a base functionality for a logic circuit, wherein the logic circuit is configured as a symmetrical multi-bit generator that alternates between a multi-bit output, which is correlated from a binary input, and one of a high or low bit pattern according to a control input;
defining a plurality of blocks having a transmission gate block to provide the multi-bit output and a state driver block to supply the high or low bit pattern, each of the plurality of blocks configured to provide the base functionality; and
recursively coupling the plurality of blocks to provide an aggregate logic circuit that is configured to provide a symmetrical output responsive to the multi-bit input and the control input.

12. The method of claim 11, wherein the symmetrical multi-bit generator is configured to generate thermometer code or BCD code.

13. The method of claim 11, further comprising alternating between a first output subset and a second output subset based on the control input.

14. The method of claim 13, further comprising causing one of the first output subset to be inactive and the second output subset to drive the multi-bit output or causing one of the first output subset to drive the multi-bit output and the second output subset to be inactive.

15. The method of claim 14, further comprising supplying the high or low bit pattern to the inactive of the first output subset or the second output subset.

16. The method of claim 11, further comprising configuring complimentary transistor pairs to pass the multi-bit output in each of the plurality of blocks based on the control input.

17. The method of claim 16, further comprising configuring a first bank of transistors tied to a drain voltage to supply the high bit pattern and configuring a second bank of transistors tied to a source ground to supply the low bit pattern.

18. An integrated circuit chip, comprising:
an upper transmission gate block to supply a multi-bit output at a first output in response to being activated by a control input, the multi-bit output being correlated to a multi-bit input;
a high state driver to provide a high bit pattern at the first output in response to the upper transmission gate block being deactivated by the control input;
a lower transmission gate block to supply a multi-bit output at a second output in response to being activated by the control input, the multi-bit output at the second output being correlated to the multi-bit input and being activated alternately from activation of the upper transmission gate block; and
a low state driver to provide a low bit pattern at the second output in response to the lower transmission gate block being deactivated by the control input.

19. The integrated circuit chip of claim 18, wherein the upper transmission gate block, the high state driver, the lower transmission gate block, and the low state driver are configured as an aggregate recursive block, the integrated circuit chip comprising a plurality of the recursive blocks to provide a logic circuit.

20. The integrated circuit chip of claim 18, wherein the control input causes the high bit pattern or the low bit pattern to be provided at the inactive of the first output or the second output.

* * * * *